(12) United States Patent
Yamashita (10) Patent No.: US 10,971,351 B2
(45) Date of Patent: Apr. 6, 2021

(54) WAFER SURFACE BEVELING METHOD, METHOD OF MANUFACTURING WAFER, AND WAFER

(71) Applicant: SUMCO CORPORATION, Tokyo (JP)

(72) Inventor: Kenji Yamashita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/570,061

(22) Filed: Sep. 13, 2019

(65) Prior Publication Data

US 2020/0090923 A1    Mar. 19, 2020

(30) Foreign Application Priority Data

Sep. 14, 2018   (JP) .............................. JP2018-172843

(51) Int. Cl.
*H01L 21/02* (2006.01)
*B24B 37/20* (2012.01)
*B24B 37/08* (2012.01)

(52) U.S. Cl.
CPC ........ *H01L 21/02021* (2013.01); *B24B 37/08* (2013.01); *B24B 37/20* (2013.01); *H01L 21/02013* (2013.01); *H01L 21/02024* (2013.01)

(58) Field of Classification Search
CPC ......... H01L 21/02021; H01L 21/02013; H01L 21/02024; B24B 37/20; B24B 37/08
See application file for complete search history.

(56) References Cited

U.S. PATENT DOCUMENTS

2009/0124174 A1   5/2009  Fukushima et al.
2015/0283664 A1   10/2015 Kato et al.
(Continued)

FOREIGN PATENT DOCUMENTS

DE    102013210057 A1   12/2014
JP    2-301135            12/1990
(Continued)

OTHER PUBLICATIONS

Office Action for TW App. No. 10920349250, dated Apr. 16, 2020 (w/ translation).
(Continued)

*Primary Examiner* — Caridad Everhart
(74) *Attorney, Agent, or Firm* — Greenblum & Bernstein, P.L.C.

(57) ABSTRACT

Example features relate to a method of polishing a chamfered wafer surface, the method including beveling a wafer to generate the chamfered wafer surface, the chamfered wafer surface being inclined with respect to a main wafer surface by an angle θ; and polishing the chamfered wafer surface with a polishing pad, a polishing surface of the polishing pad being inclined with respect to the chamfered wafer surface by an angle α; wherein the angle α is equal to or smaller than the angle θ. Example features relate to a system for polishing the chamfered surface, the system including a polishing pad mounting jig configured to polish the chamfered surface, an angle θ being defined between the chamfered surface and the main surface; and a polishing pad in contact with the chamfered surface at an angle α during polishing; wherein the angle α is smaller than the angle θ.

23 Claims, 7 Drawing Sheets

(56) References Cited

U.S. PATENT DOCUMENTS

| | | | |
|---|---|---|---|
| 2016/0005593 A1* | 1/2016 | Yamaguchi | H01L 21/30625 451/44 |
| 2017/0330783 A1 | 11/2017 | Torii | |
| 2018/0342383 A1 | 11/2018 | Roettger et al. | |
| 2019/0345635 A1* | 11/2019 | Vogel | C30B 29/60 |
| 2020/0114488 A1* | 4/2020 | Tanaka | H01L 21/30625 |

FOREIGN PATENT DOCUMENTS

| | | |
|---|---|---|
| JP | 10-29142 A | 2/1998 |
| JP | H11-188590 | 7/1999 |
| JP | 2000-141190 A | 5/2000 |
| JP | 2002-187050 A | 7/2002 |
| JP | 2007-42748 | 2/2007 |
| JP | 2009-119537 A | 6/2009 |
| JP | 4826013 B2 | 11/2011 |
| JP | 2016-111116 A | 6/2016 |
| JP | 2017-117915 A | 6/2017 |
| TW | 201620672 A | 6/2016 |
| WO | 2013/168444 | 11/2013 |
| WO | 2018/037755 | 3/2018 |

OTHER PUBLICATIONS

International Search Report for International Patent Application No. PCT/JP2019/035936, dated Nov. 26, 2019; and English-language translation thereof.

* cited by examiner

WAFER SURFACE BEVELING METHOD, METHOD OF MANUFACTURING WAFER, AND WAFER

CROSS-REFERENCE TO RELATED APPLICATIONS

The present application claims priority under 35 U.S.C. § 119 to Japanese Application No. 2018-172843, filed on Sep. 14, 2018, the disclosure of which is expressly incorporated by reference herein in its entirety.

BACKGROUND OF THE DISCLOSURE

1. Field of the Disclosure

The present disclosure relates to a wafer surface beveling method, a method of manufacturing a wafer, and a wafer.

2. Description of Related Art

A semiconductor device may be manufactured by performing beveling, lapping, etching, double-surface polishing, mirror surface beveling, finishing polishing, and the like on a wafer that is sliced off a single crystal ingot, after which an electrical circuit or the like is formed on a main surface of the wafer in a device process. Herein, "beveling" refers to a treatment in which a chamfered surface is formed on a circumferential edge portion of a wafer using a grindstone for beveling or the like, and "mirror surface beveling" refers to a treatment in which the chamfered surface that is formed by beveling is polished to a mirror state using a polishing pad.

In Japanese Patent Laid-open Publication No. H11-188590, mirror surface beveling is performed on a beveled wafer. Specifically, with a wafer that has been beveled such that an angle that is formed by the main surface of the wafer and the surface of a chamfered portion of the wafer is approximately 22°, a polishing pad is pressed against the chamfered surface of the wafer such that an angle between the polishing pad and the main surface of the wafer is approximately 450. After beveling, which creates the chamfered surface, the resulting chamfered surface is subjected to mirror polishing.

However, in the mirror polished surface of the chamfered surface of the wafer treated according to the method of Japanese Patent Laid-open Publication No. H11-188590, there is a potential for debris to be generated by the wafer coming into contact with a wafer chuck or a groove within a wafer housing container during a washing step of the wafer and/or any subsequent manufacturing steps.

SUMMARY OF THE DISCLOSURE

In view of the challenges noted above, example features of the present disclosure provide a wafer mirror surface beveling method in which corner burrs at a boundary between a main surface of a wafer and a chamfered surface of the same wafer can be reduced or inhibited. Example features of the present disclosure also provide a wafer manufacturing method for manufacturing a wafer in which corner burrs at the boundary between the main surface of the wafer and the chamfered surface of the wafer are reduced or inhibited. Example features of the present disclosure also provide a wafer in which corner burrs at the boundary between the main surface and the chamfered surface of the wafer are reduced or inhibited.

The term "beveling" is used herein to describe the process of polishing the wafer, and the term "chamfered" is used herein the describe the state of the surface that has been beveled, i.e., chamfered.

Example features of a method of beveling include:

(1) A wafer mirror surface beveling method that mirror polishes a chamfered surface of a wafer with a polishing pad, and an angle $\alpha$, between the main surface of the polishing pad and the main surface of the wafer during beveling of the wafer, is smaller than or equal to an angle $\theta$ between the main surface of the wafer and the chamfered surface of the wafer.

(2) The wafer mirror surface beveling method described in (1) above, in which the target value of the angle $\theta$ is substantially 220 or more to substantially 260 or less.

(3) The wafer mirror surface beveling method described in (2) above, in which the angle $\alpha$ is configured to be equal to substantially 19° or more.

(4) The wafer mirror surface beveling method described in any one of (1) to (3) above, wherein a wafer beveling device includes a stage configured to attach the wafer by adhesion and that rotates while holding the wafer. The wafer beveling device also includes a polishing pad mounting jig in which the polishing pad is applied to the wafer at an inclined surface with respect to the main surface of the wafer during beveling, the polishing pad mounting jig being configured to oscillate along a longitudinal direction of the inclined surface. An angle formed by the inclined surface of the polishing pad mounting jig and the main surface of the wafer is referred to as angle $\alpha$, and the polishing pad is in constant contact with the beveled surface of the wafer that is rotated by the stage, the polishing pad mounting jig oscillating along the inclined surface.

(5) The wafer mirror surface beveling method described in any one of (1) to (3) above, wherein the wafer surface beveling device includes a stage configured to attach and hold the wafer by adhesion, and a polishing pad mounting jig in which the polishing pad is applied to an inclined surface with respect to the main surface of the wafer. In example features, the polishing pad mounting jig is configured to oscillate along a longitudinal direction of the inclined surface, an angle formed by the inclined surface of the polishing pad mounting jig and the main surface of the wafer is the angle $\alpha$, and the polishing pad is in constant contact with the chamfered surface of the wafer that is held by the stage. In example features, the polishing pad mounting jig is displaced along a circumferential direction of the wafer while oscillating along a longitudinal direction of the inclined surface.

(6) The wafer mirror surface beveling method described in one of (4) and (5) above, wherein the diameter of the stage holding the wafer decreases in a direction from a surface on the side to which the wafer is attached to a surface on the opposite side therefrom.

(7) The wafer mirror surface beveling method described in (6) above, in which an angle $\theta$ formed by a side surface of the stage and the surface on the side of the stage to which the wafer is attached by adhesion is less than or equal to substantially 20°.

(8) A wafer manufactured via the wafer surface beveling method described in any one of (1) to (7) above.

(9) A wafer in which a degree of corner burring reduction or inhibition at a front surface/chamfer boundary and/or a degree of corner burring reduction or inhibition at a rear surface/chamfer boundary is substantially 180 µm or more.

(10) The wafer described in (9) above, in which the degree of corner burring reduction or inhibition at the front surface/ chamfer boundary and/or the degree of corner burring inhibition at the rear surface/chamfer boundary is substantially 200 μm or more.

(11) The wafer described in (9) above, in which the degree of corner burring reduction or inhibition at the front surface/chamfer boundary and/or the degree of corner burring inhibition at the rear surface/chamfer boundary is substantially 230 μm or less.

(12) The wafer described in one of (9) and (10) above, in which an ESFQRmax is substantially 45 nm or less, ESFQRmax being an indication of the flatness of the wafer after being polished.

In addition, upon carefully observing a surface of the mirror-polished surface beveled wafer, corner burrs develop at a boundary between the main surface of the wafer and the chamfered surface, and there is a potential for debris to be generated. Accordingly, in example features of the present disclosure, a wafer can be obtained by the method described above in which corner burrs at the boundary between the main surface and the chamfered surface of the wafer are reduced or inhibited.

BRIEF DESCRIPTION OF THE DRAWINGS

Example features of the present disclosure are further described in the detailed description which follows, in reference to the noted plurality of drawings by way of non-limiting example features of the present disclosure, in which like reference numerals represent similar parts throughout the several views of the drawings, and wherein.

DETAILED DESCRIPTION OF THE DISCLOSURE

The particulars shown herein are by way of example and for purposes of illustrative discussion of example features of the present disclosure only and are presented to illustrate what is believed to be the most useful and readily understood description of the principles and conceptual aspects of the example features. In this regard, no attempt is made to show structural details of the example features in more detail than is necessary for the fundamental understanding thereof, the description taken with the drawings making apparent to those skilled in the art how the forms of the example features may be embodied in practice.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the features may be cylindrical, other tubular cross-sectional forms are contemplated, such as square, rectangular, oval, triangular and others.

In the drawing figures, the dimensions of layers and regions may be exaggerated for clarity of illustration. Like reference numerals refer to like elements throughout. The same reference numbers indicate the same components throughout the specification. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example features are described herein with reference to cross-sectional illustrations that are schematic illustrations of idealized features (and intermediate structures) of example features. As such, variations from the shapes of the illustrations as a result, for example, of manufacturing techniques and/or tolerances, are to be expected. Thus, example features should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example features.

Figure 1:
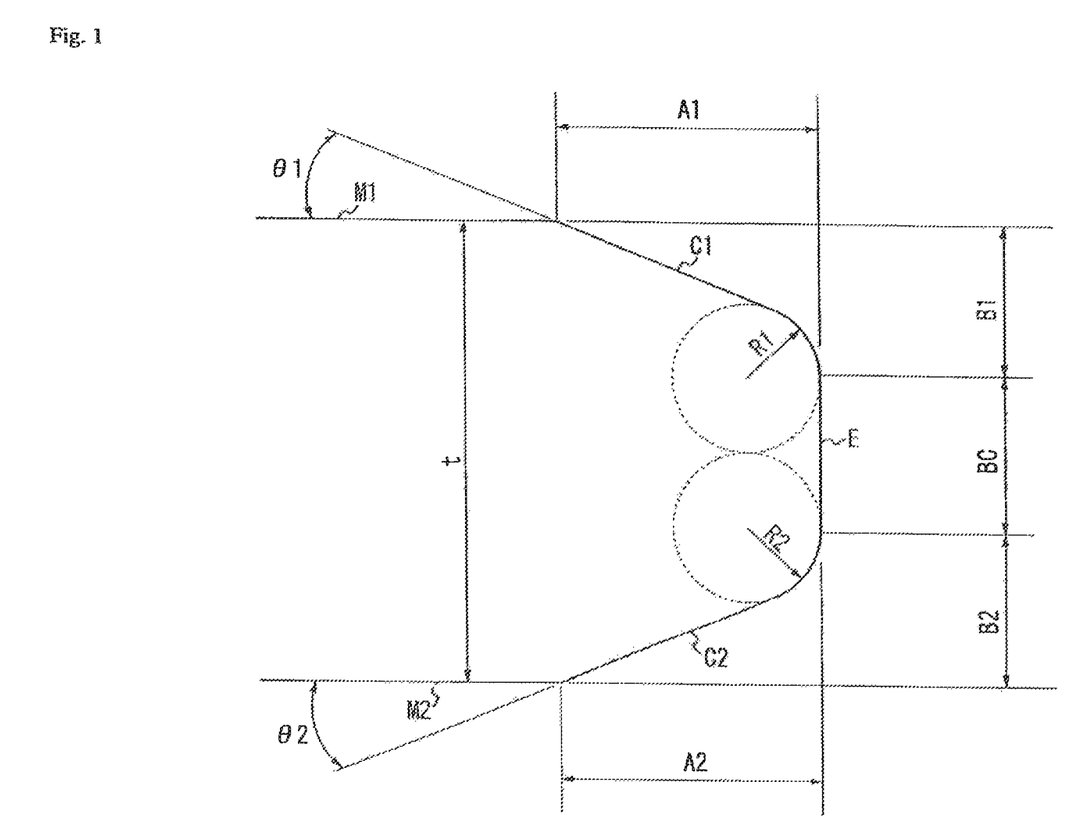
FIG. 1 is a schematic cross-sectional view illustrating a shape of a circumferential edge of a wafer obtained via a wafer surface beveling method, according to example features of the present disclosure.

FIG. 1 is a schematic cross-sectional view illustrating a shape of a circumferential edge of a wafer obtained via a wafer mirror surface beveling method, according to example features of the present disclosure. In example features, the circumferential edge of the wafer includes an end surface E that is substantially perpendicular to a main surface M of a front surface side of the wafer and to a main surface M2 of a rear surface side of the wafer; a top chamfered surface C1 that connects the main surface M1 to the end surface E; and a bottom chamfered surface C2 that connects the main surface M2 to the end surface E. A wafer having the shape illustrated in FIG. 1 can be obtained by, for example, beveling a wafer that is cut from a single crystal ingot, where both front and rear surfaces are polished.

In FIG. 1, $\theta 1$ is an angle formed by the main surface M1 of the front surface side of the wafer and the top chamfered surface C1 (hereafter referred to as a "top chamfer angle"). $\theta 2$ is an angle formed by the main surface M2 of the rear surface side of the wafer and the bottom chamfered surface C2 (hereafter referred to as a "bottom chamfer angle"). Specifically, in example features, of the angles $\theta$ formed by the main surfaces and the chamfered surfaces of the wafer, the angle for the front surface side is defined as $\theta 1$ and the angle for the rear surface side is defined as $\theta 2$. During the beveling process of the wafer, target values for $\theta 1$ and $\theta 2$ may be the same or different, and may be in the range of substantially 22° or more to substantially 26° or less. In example features, the range of angle values for $\theta 1$ and $\theta 2$ may be established via the shape of the groove in the jig (such as a beveling wheel) that is used during the beveling. In example features, the angles $\theta 1$ and $\theta 2$ may deviate from the range of 22° or more to 26° or less by ±1° due to friction of the groove in the jig, a polishing machining allowance in double-surface polishing, or the like. When the target values of $\theta 1$ and $\theta 2$ are greater than 26°, the chamfer angle on the wafer prior to being subjected to the mirror surface beveling is larger, and therefore the reduction or inhibition of the corner burrs is more difficult and is thus reduced. In example features, the values of angles $\theta 1$ and $\theta 2$ may be in the range of 22° to 23°. In example features, the values of angles $\theta 1$ and $\theta 2$ may be equal to substantially 22°.

In example features, the label "t" in FIG. 1 refers to the thickness of the circumferential edge of the wafer, and can be set to be substantially between 760 μm and 790 μm. A1 indicates a top chamfer width and A2 indicates a bottom chamfer width, and A1 and A2 can be set to both be substantially equal to between 200 μm and 450 μm. B1 indicates a top chamfer thickness and B2 indicates a bottom chamfer thickness, and B1 and B2 can be set to both be substantially equal to between 80 μm and 240 μm. R1 indicates a curvature radius of a top chamfered portion and R2 indicates a curvature radius of a bottom chamfered portion, and R1 and R2 can both be set to be equal to between 200 μm and 250 μm. BC indicates the length of the end surface in the thickness direction of the wafer, and can be set to be equal to between 300 μm and 600 μm. FIG. 1 illustrates a wafer where the length BC is non-zero, but a wafer obtained by the wafer surface beveling method according to example features may also result in a round wafer where BC is equal to 0.

Figure 2A:
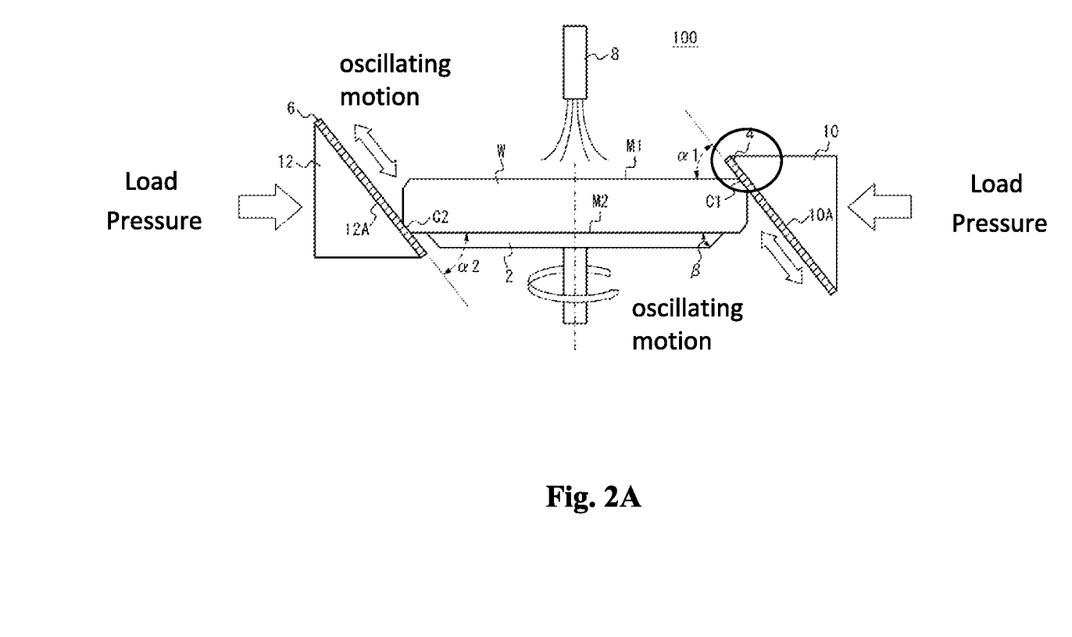
FIGS. 2A and 2B are schematic views illustrating a wafer surface beveling device, according to example features of the present disclosure.

FIGS. 2A and 2B are schematic views illustrating a wafer mirror surface beveling device, according to example features of the present disclosure. With reference to FIG. 2A, the mirror surface beveling device 100 includes a stage 2 to which the wafer W is attached, e.g., by adhesion or other method, the stage 2 being configured to rotate the wafer W attached thereto; a first polishing pad 4 positioned so as to contact the top chamfered surface C1 of the wafer W; a second polishing pad 6 positioned so as to contact the bottom chamfered surface C2 of the wafer W; and a slurry supply mechanism 8 configured to supply a polishing slurry to the circumferential edge of the wafer W, the polishing slurry to be supplied during the polishing of the wafer.

In example features, the first polishing pad 4 is provided on an inclined surface 10A of a first polishing pad mounting jig 10. In example features, the first polishing pad mounting jig 10, which includes the first polishing pad 4 at a surface thereof, is configured to oscillate along a longitudinal direction of the inclined surface 10A, and as a result the first polishing pad 4 oscillates along the longitudinal direction of the inclined surface 10A. In addition, the second polishing pad 6 is provided on an inclined surface 12A of a second polishing pad mounting jig 12. The second polishing pad mounting jig 12, which includes the second polishing pad 6 at a surface thereof, is configured to oscillate along a longitudinal direction of the inclined surface 12A of the wafer and as a result, the second polishing pad 6 also oscillates along the inclined surface 12A. In this example, the first and second polishing pad mounting jigs 10 and 12 are positioned facing each other with the wafer W therebetween in a plan view of the mirror surface beveling device 100. In example features, the mechanism that causes the first and second polishing pad mounting jigs 10 and 12 to oscillate is not particularly limited, and for example a slide mechanism that is driven by an air cylinder, servo motor, or the like can be used.

In example features, a polishing pad having a compressibility of substantially 1.5% to 7.5% may be used for the first and second polishing pads 4 and 6. In example features, a polishing pad having a compressibility of substantially 3.5% to 7.5% may be used for the first and second polishing pads 4 and 6. Polishing pads having such compressibility are harder polishing pads than a polishing pad used in generic mirror surface beveling which typically have a compressibility or 9% or more, and are capable of preventing portions of the top and bottom chamfered surfaces C1 and C2 that are near the side of the end surface E of the wafer from being left unpolished, while also reducing or inhibiting over-polishing of the wafer. A material for a polishing pad as discussed above may be, for example, a polyurethane non-woven fabric. In addition, the thickness of the first and second polishing pads 4 and 6 may be in the range of substantially 1.0 mm to 2.0 mm.

In example features, in order to avoid unwanted contact between the stage 2 and the first and second polishing pad mounting jigs 10 and 12 or between the stage 2 and the first and second polishing pads 4 and 6 when the first and second polishing pad mounting jigs 10 and 12 oscillate during polishing of the wafer, the diameter of the stage 2 holding the wafer may decrease in a direction away from the side to which the wafer W is attached to the stage 2 and toward the opposite surface of the stage 2. Specifically, an angle β formed by a side surface of the stage 2 and the surface of the stage 2 on the side to which the wafer W is attached by adhesion is preferably configured to be in the range of substantially 20° or less. In addition, the diameter of the stage 2 at the surface on the side to which the wafer W is attached by adhesion may be configured to be substantially 4 mm to 10 mm smaller than the diameter of the wafer W. By doing so, the stage 2 and the first and second polishing pads 4 and 6 can be substantially prevented from interfering with each other without reducing the adhesion force of the polishing pads 4 and 6 to the polishing pad mounting jigs 10 and 12.

Example features of the wafer mirror surface beveling method that can be performed using the mirror surface beveling device 100 are described below.

With reference to FIG. 2A, in example features, when the wafer W is rotated by rotation of the stage 2, the first polishing pad 4 is brought into contact, e.g., into constant contact, with the top chamfered surface C1 of the wafer W, and the second polishing pad 6 is brought into contact, e.g., into constant contact, with the bottom chamfered surface C2 of the wafer W, the first polishing pad mounting jig 10 oscillates along the longitudinal direction of the inclined surface 10A and the second polishing pad mounting jig 12 oscillates along the longitudinal direction of the inclined surface 12A. In example features, during polishing, a load is applied to the first and second polishing pad mounting jigs 10 and 12, along a direction that runs from the circumferential edge of the wafer W to the center of the wafer W, i.e., along a radial direction of the stage 2, and the slurry from the slurry supply mechanism 8 is supplied to the circumferential edge of the wafer W. Due to the oscillation of the first polishing pad mounting jig 10, the first polishing pad 4 also oscillates along the longitudinal direction of the inclined surface 10A, and due to oscillation of the second polishing pad mounting jig 12, the second polishing pad 6 oscillates along the longitudinal direction of the inclined surface 12A. Accordingly, the top chamfered surface C1 is polished, e.g., mirror polished, by the first polishing pad 4, and the bottom chamfered surface C2 is polished, e.g., mirror polished, by the second polishing pad 6. In example features, a rotation speed of the wafer W can be configured to be between substantially 300 rpm and 1500 rpm, a magnitude of the load applied to the first and second polishing pad mounting jigs can be configured to be between substantially 30 N and 60 N, and an oscillation speed can be configured to be between substantially 1 mm/s and 8 mm/s. In addition, a known alkaline slurry containing colloidal silica may be used for the slurry.

Referring back to FIG. 1, in example features, the angle $\alpha 1$ between the surface of the first polishing pad 4 and the main surface M1 of the wafer W during the mirror surface beveling process is equal to or less than the top chamfer angle $\theta 1$ of the wafer W. In example features, the angle $\alpha 2$ between the surface of the second polishing pad 6 and the main surface M2 of the wafer W during the mirror surface beveling process is equal to or less than the bottom chamfer angle $\theta 2$ of the wafer W. Hereafter, advantages of the above relationship between the angles $\alpha 1$ and $\theta 1$, and between the angles $\alpha 2$ and $\theta 2$, respectively, are described.

Figure 2B:
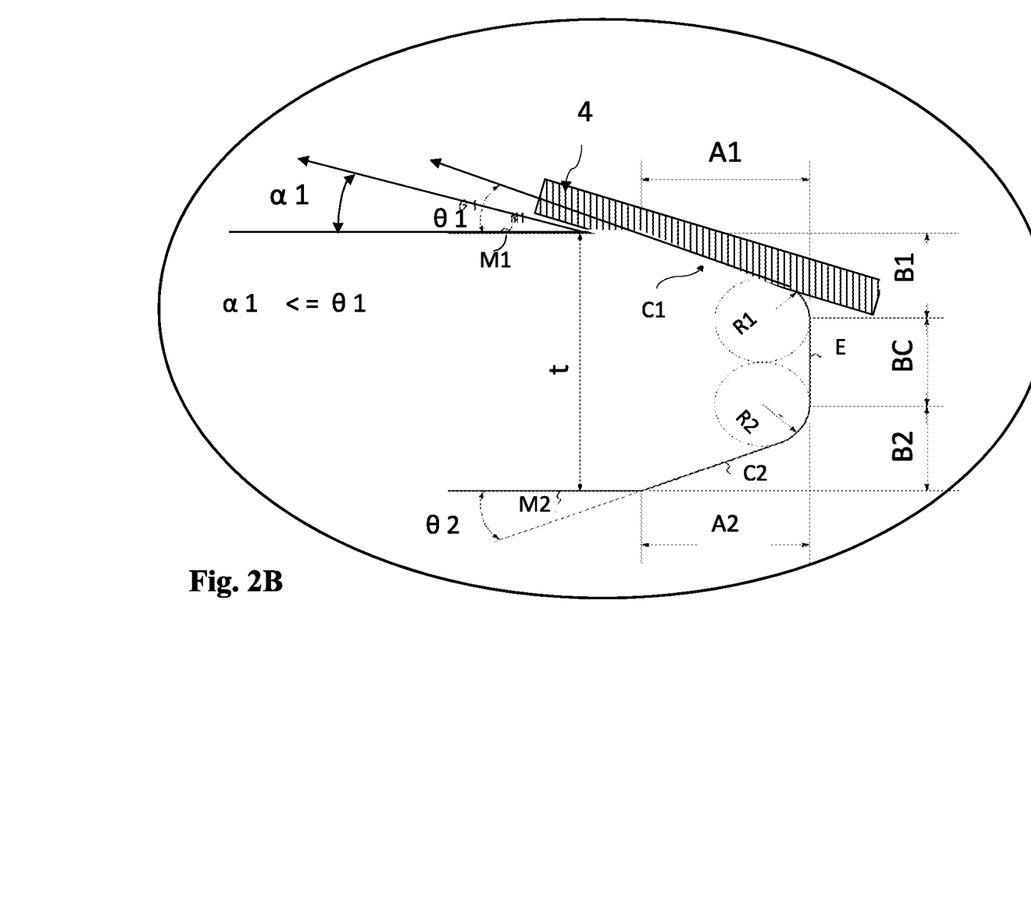

FIG. 2B is a magnified illustration of the intersection between the first polishing pad 4, the main surface M1 and the top chamfered surface C1. In FIG. 2B, the angle $\theta 1$ between the top chamfered surface C1 and the main surface M1 is shown, as well as the angle $\alpha 1$ between the main surface M1 and the surface of the first polishing pad 4 during the mirror surface beveling process. In FIG. 2B, the relationship between angles $\theta 1$ and $\alpha 1$ is illustrated, where $\alpha 1$ is smaller than $\theta 1$. In example features, a similar relationship exists at the intersection between the second polishing pad 6, the main surface M2 and the bottom chamfered surface C2. Specifically, the angle $\alpha 2$ between the main surface M2 and the surface of the second polishing pad 6 during the mirror surface beveling process is smaller than the angle $\theta 2$ between the bottom chamfered surface C2 and the main surface M2.

In conventional mirror surface beveling, the angle $\alpha$ formed by the main surface of the polishing pad and the main surface of the wafer during the mirror surface beveling process is typically larger than the chamfer angle $\theta$. This is because when the angle $\alpha$ is configured to be too small, a region spanning several hundred micrometers (μm) or more towards the center of the wafer from a boundary between the main surface and the chamfered surface may potentially be over-polished. Although over-polishing may be reduced by conventional methods, a typical challenge in such conventional method in which corner burrs are formed at the boundary between the main surface of the wafer and the chamfered surface is that the polishing at the boundary is insufficient, which may cause debris to be produced during the final washing of the wafer or during subsequent or other steps.

In order to avoid the above disadvantages of the conventional polishing methods, example features have an angle $\alpha$ that is configured to be smaller than in the conventional methods, and such a smaller angle $\alpha$ results in a substantial reduction of the over-polishing. Moreover, example features have the angle $\alpha$ to be equal to or less than the chamfer angle $\theta$ at the time of beveling, which results in reducing or inhibiting the creation of corner burrs while also limiting over-polishing to an acceptable level.

Figure 3A:
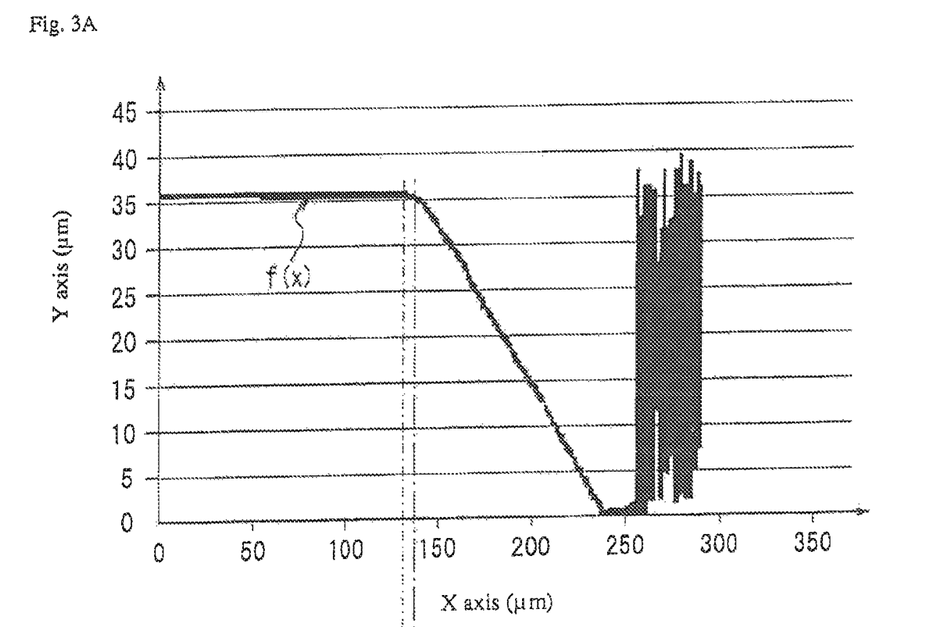
FIGS. 3A, 3B and 3C illustrate methods of quantifying corner burrs, according to example features of the present disclosure.
Figure 3B:
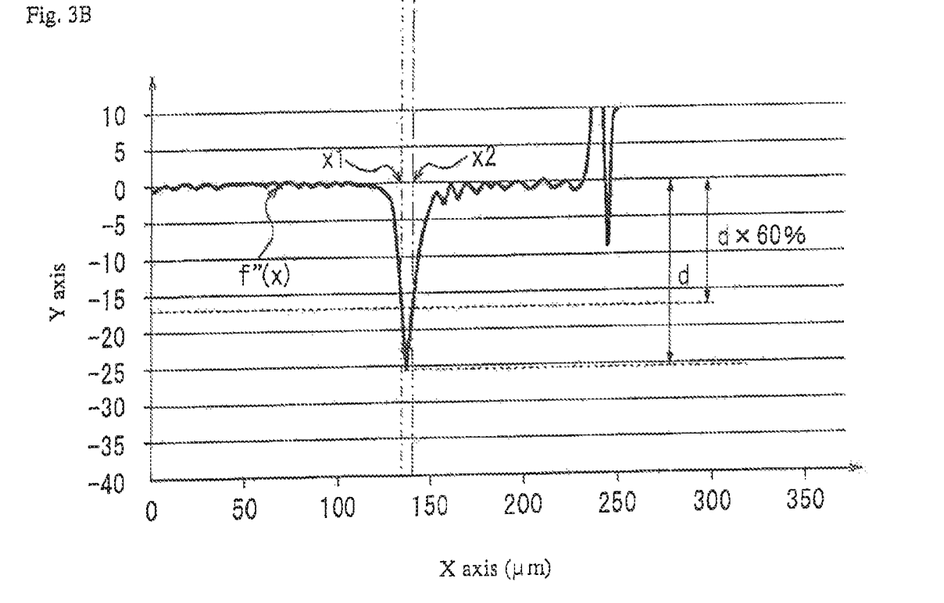
Figure 3C:
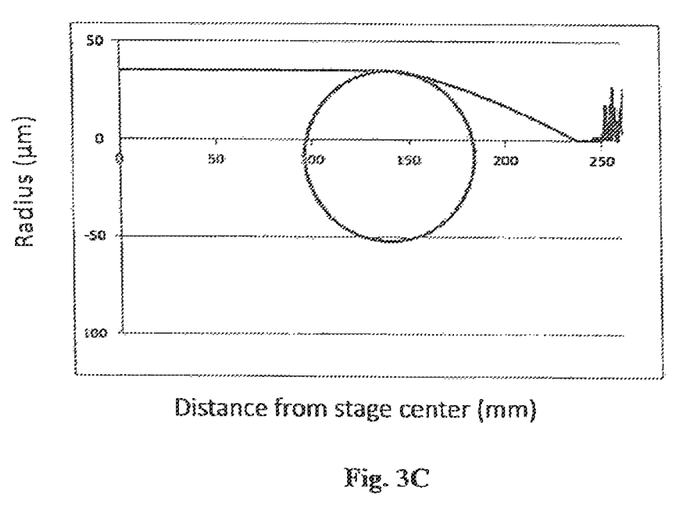

FIGS. 3A, 3B and 3C illustrate methods of quantifying corner burrs, according to example features of the present disclosure. The corner burrs in example features can be quantified with the following method. First, using a known laser microscope, a surface shape of a wafer is scanned in a diameter or radial direction. Specifically, a scanning direction is designated as the X axis; a position that is 400 μm to 600 μm closer to the center than an outer circumferential edge of the main surface of the wafer is designated as a starting point of the scan (X coordinate origin point); and a position that is 100 μm to 300 μm closer to the center than the outer circumferential edge of the wafer is designated as an end point of the scan. Accordingly, a contour curve (f(x)) illustrated in FIG. 3A can be obtained. Next, using a known analysis method, the second derivative of the contour curve (f(x)) is found for x, thereby obtaining a second derivative curve (f''(x)) illustrated in FIG. 3B. Next, of the peaks exhibited in the second derivative curve (f''(x)), a peak having a maximum depth (hereafter referred to as the "maximum peak") is derived. In example features, the depth of the maximum peak is designated as "d," and the X coordinates for the intersections of y=−d×60% and y=f''(x) are designated as "x1" and "x2," respectively. In example features, the contour curve (f(x)) in a region where x1≤x≤x2 is fitted to a circle, as illustrated in FIG. 3C, using a known analysis method. The size of a radius of the circle illustrated in FIG. 3C that is fitted as discussed above is used as an indicator of corner burrs. In example features, the larger the radius of the fitted circle, the more reduced or inhibited the corner burrs at the boundary between the main surface and the chamfered surface of the wafer. When scanning the main surface M1 illustrated in FIGS. 2A and 2B, the radius of the fitted circle illustrated in FIG. 3C, calculated in micrometers (μm), is indicative of and proportional to the reduction or inhibition of corner burring at the front surface/chamfer boundary. In example features, when scanning the main surface M2, the radius of the circle illustrated in FIG. 2C, also measured in μm, is also indicative of and proportional to the reduction or inhibition of corner burring at the rear surface/chamfer boundary. In example features, in a region where x≥230 μm, FIGS. 3A and 3B show a fluctuation of the curves f(x) and f''(x), but these fluctuations are due to noise and bear no relevance to the surface shape of the wafer.

In example features, with reference to FIG. 1, during the beveling process of the wafer, target values for the top chamfer angle $\theta 1$ and the bottom chamfer angle $\theta 2$ may be within the range of substantially 220 or more to 26° or less. In example features, the angles $\theta 1$ and $\theta 2$ may be within the range of substantially 22° or more to 23° or less. In example features, the angles $\theta 1$ and $\theta 2$ may be equal to substantially 22°. In such a case, with further reference to FIG. 2A, by setting the angle $\alpha 1$ at substantially 22° or less, the degree of corner burring reduction or inhibition at the front surface/chamfer boundary can be equal to substantially 180 μm or more. Furthermore, by setting the angle α2 at substantially 22° or less, the degree of corner burring reduction or inhibition at the rear surface/chamfer boundary can be equal to substantially 180 μm or more. Moreover, by setting the angle α1 to substantially 21° or less, corner burrs can be reliably reduced or inhibited, even when the chamfer angle θ1 of the wafer used in the surface beveling varies. For example, even when θ1 is equal to substantially 22°±1° due to variation in the chamfer angle, the degree of corner burring reduction or inhibition at the front surface/chamfer boundary can be equal to substantially 20° μm or more. Moreover, by setting the angle α2 to substantially 21° or less, corner burrs can be reliably reduced or inhibited even when the chamfer angle θ2 of the wafer resulting from the surface beveling varies. For example, even when θ2 is equal to substantially 22°±1° due to variation in the chamfer angle, the degree of corner burring reduction or inhibition at the rear surface/chamfer boundary can be equal to substantially 200 μm or more.

In example features, from the viewpoint of restricting over-polishing on the front surface side of the wafer W to an acceptable level, setting the angle α1 to substantially 20° or more is advantageous. In example features, from the viewpoint of restricting over-polishing on the rear surface side of the wafer W to an acceptable level, setting the angle α2 to substantially 20° or more is advantageous. The statement that "over-polishing is at an acceptable level" means that an ESFQRmax is equal to substantially 45 nm or less.

"ESFQRmax," as it appears in the instant specification, is determined based on an edge site front least squares range (ESFQR), as defined in the SEMI standard M67. Specifically, an annular region of between 1 and 30 mm from the outer circumferential end of the wafer, following the diameter direction, is divided into 72 wedge-shaped sectors along a circumferential direction of the wafer. Then, from a thickness distribution within each wedge, a positive maximum displacement amount and a negative maximum displacement amount from a reference plane that is found using the least squares method are taken as absolute values, and the sum thereof is designated as the ESFQR for each sector. Then, the largest of these ESFQRs is designated as the ESFQRmax.

In other words, when a1 is set to substantially 20° or more to 22° or less, the ESFQRmax can be configured to be equal to substantially 45 nm or less while the degree of corner burring reduction or inhibition at the front surface/chamfer boundary can be configured to be equal to substantially 180 μm or more, and when α1 is set to substantially 20° or more to 21° or less, the ESFQRmax can be configured to be equal to substantially 45 nm or less while the degree of corner burring reduction or inhibition at the front surface/chamfer boundary can be configured to be equal to substantially 200 μm or more. Similarly, when α2 is set to substantially 20° or more to 22° or less, the ESFQRmax can be configured to be equal to substantially 45 nm or less while the degree of corner burring reduction or inhibition at the rear surface/chamfer boundary can be equal to substantially 180 μm or more, and when α2 is set to substantially 20° or more to 21° or less, the ESFQRmax can be equal to substantially 45 nm or less while the degree of corner burring reduction or inhibition at the rear surface/chamfer boundary can be equal to substantially 200 μm or more.

In the foregoing description, the above example features are relied on to describe a wafer mirror surface beveling method. However, the example features are not limited to the examples discussed and described above, and appropriate modifications are possible within the scope of the patent claims.

For example, in example features, wafer surface beveling, or wafer mirror surface beveling, can be performed using a mirror surface beveling device described below. Specifically, the mirror surface beveling process can be performed using a wafer mirror surface beveling device that is provided with a stage configured to be attached to a wafer and to hold the wafer, and a polishing pad mounting jig in which a polishing pad is applied to a surface of the jig that is inclined with respect to the main surface of the wafer, the polishing pad mounting jig being configured to oscillate along a longitudinal direction of the inclined surface. In example features, when the inclined surface of the polishing pad mounting jig is at an angle α with respect to the main surface of the wafer, the polishing pad being in constant contact with the chamfered surface of the wafer that is held on the stage, the polishing pad mounting jig is displaced along the circumferential direction of the wafer while oscillating along the longitudinal direction of the inclined surface, and the wafer is stationary. That is, this example surface beveling method differs from the beveling method illustrated in FIG. 2A in that the wafer is fixed in place without rotating while the polishing pad mounting jig is displaced along the circumferential direction of the wafer. In all other respects, the subject matter described with respect to FIG. 2A applies.

Next, an example is described of a wafer manufacturing method according to example features. The wafer manufacturing method according to example features includes surface beveling the wafer using the wafer beveling method described above. Specifically, a wafer is first obtained by slicing a single crystal ingot. Next, using a known grindstone for beveling, the wafer is beveled and a wafer having a chamfered surface is obtained. Next, lapping, followed by etching, are performed on the wafer having the chamfered surface. Next, double-surface polishing of the wafer is performed using a double-surface polishing device. Next, mirror surface beveling of the wafer is performed using the mirror surface beveling method described above. Next, finishing polishing of the wafer is performed using a single-surface polishing device. Next, washing of the wafer is performed using a washing method. In example features, the amount of polishing performed during the finishing polishing is slight, and therefore the degree of corner burring reduction or inhibition at the front surface/chamfer boundary, the degree of corner burring reduction or inhibition at the rear surface/chamfer boundary, and the value of the ESFQRmax do not substantially fluctuate.

A wafer in which corner burrs are reduced or inhibited can be obtained according to the example features discussed above.

In the foregoing description, the example features are merely examples describing a wafer manufacturing method, but are not limited to these examples, and appropriate modifications are possible within the scope of the patent claims.

(Exemplary Disclosure 1)

Silicon wafers having a diameter of 300 mm are sliced from a single crystal silicon ingot and are processed by beveling, lapping, etching, and double-surface polishing in that order to obtain five silicon wafers having a shape as illustrated in FIG. 1. In this example, during the wafer beveling process, a target value for θ1 and θ2 is set to 22° on a beveling processing device using a #2000 resin grindstone. Furthermore, with reference to FIG. 1, t=776 μm, A1=240 µm, A2=240 µm, B1=213 µm, B2=213 µm, BC=350 µm, R1=230 µm, and R2=230 µm.

Next, using the mirror surface beveling device illustrated in FIG. 2A, each silicon wafer is processed by mirror surface beveling under the following conditions.

α1, α2: 22°
β: 20°
First and second polishing pad type: Polyurethane nonwoven fabric
First and second polishing pad compressibility: 5%
First and second polishing pad thickness: 1.5 mm
First and second polishing pad mounting jig oscillation speed: 4 mm/sec
Load: 37 to 40 N
Wafer rotation speed: 1300 rpm
Slurry type: Colloidal silica (Exemplary Disclosure 2)

Five silicon wafers that are produced via a mirror surface beveling process are obtained with a method similar to that of Exemplary Disclosure 1. Mirror surface beveling of each silicon wafer is performed with α1=α2=21°, and is similar to Exemplary Disclosure 1 in all other respects.

(Exemplary Disclosure 3)

Five silicon wafers that are produced via a mirror surface beveling process are obtained with a method similar to that of Exemplary Disclosure 1. Mirror surface beveling of each silicon wafer is performed with α1=α2=20°, and is similar to Exemplary Disclosure 1 in all other respects.

(Exemplary Disclosure 4)

Five silicon wafers that are produced via a mirror surface beveling process are obtained with a method similar to that of Exemplary Disclosure 1. Mirror surface beveling of each silicon wafer is performed with α1=α2=19°, and is similar to Exemplary Disclosure 1 in all other respects.

Comparative Example 1

Five silicon wafers obtained via a mirror surface beveling process are obtained with a method similar to that of Exemplary Disclosure 1. Mirror surface beveling of each silicon wafer is performed with α1=α2=30°, and is similar to Exemplary Disclosure 1 in all other respects.

Comparative Example 2

Five silicon wafers that are produced via a mirror surface beveling process are obtained with a method similar to that of Exemplary Disclosure 1. Mirror surface beveling of each silicon wafer is performed with α1=α2=25°, and is similar to Exemplary Disclosure 1 in all other respects.

Comparative Example 3

Five silicon wafers that are produced via a mirror surface beveling process are obtained with a method similar to that of Exemplary Disclosure 1. Mirror surface beveling of each silicon wafer is performed with α1=α2=230, and is similar to Exemplary Disclosure 1 in all other respects.

(Evaluation Method)

The following evaluation method is used to evaluate corner burrs, over-polishing, and light point defects (LPD) for each silicon wafer obtained in each of the Exemplary Disclosures and Comparative Examples.

<Evaluation of Corner Burrs>

Figure 4:
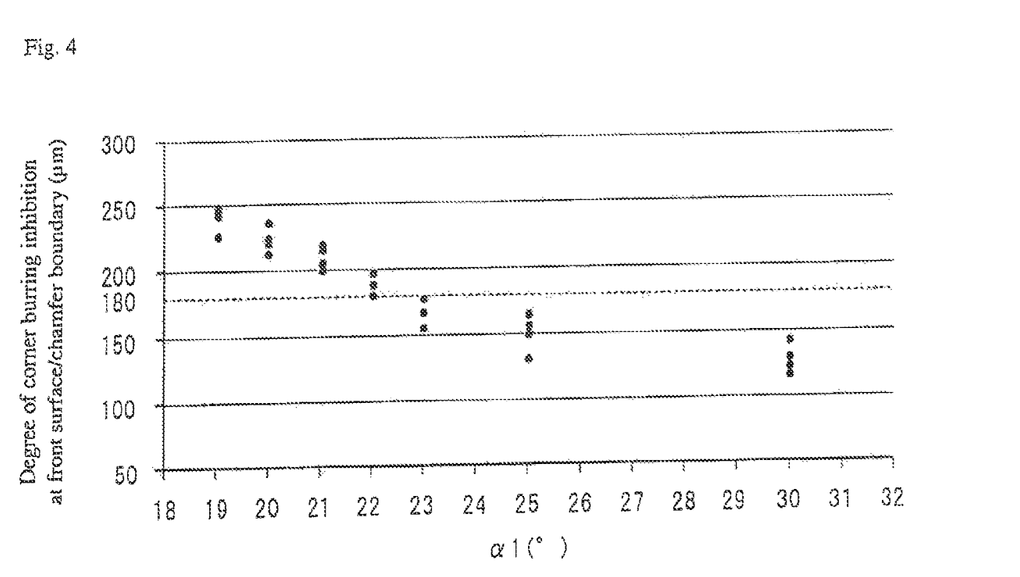
FIG. 4 is a graph illustrating a relationship between an angle α1 between the main surface of a polishing pad and the main surface of a wafer, and a degree of corner burring reduction or inhibition at a surface/chamfer boundary, according to example features of the current disclosure.

The corner burrs are evaluated by calculating the degree of corner burring reduction or inhibition at the front surface/chamfer boundary (hereafter abbreviated as "the degree of corner burring inhibition") by the noted method. The evaluation results are shown in FIG. 4. Using a VK-X200 manufactured by Keyence Corporation as the laser microscope, a position that is 400 µm closer to the center than the outer circumferential end of the front surface of the wafer is designated as the start point of the scan, and a position that is 100 µm closer to the center than the outer circumferential end of the wafer is designated as the end point of the scan. In addition, the least squares method is used for the fitting.

<Evaluation of Over-Polishing>

Figure 5:
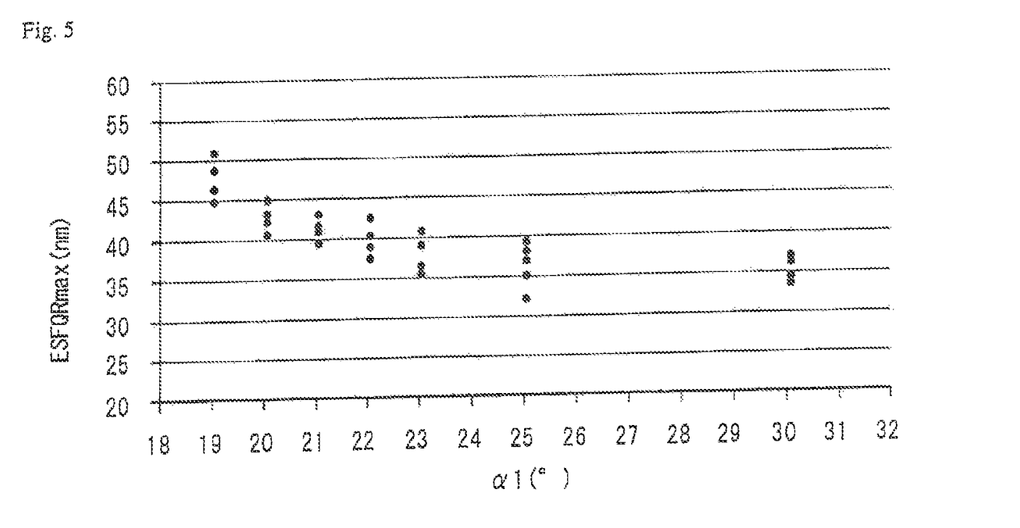
FIG. 5 is a graph illustrating a relationship between the angle α1 and the flatness of the main surface, according to example features.

Using a flatness measuring device (Wafersight 2, manufactured by KLA-Tencor Corporation), the ESFQR of each silicon wafer is measured and the ESFQRmax is calculated with the method described above. The evaluation results are shown in FIG. 5.

<Evaluation of LPD>

Each silicon wafer obtained in each of the Exemplary Disclosures and Comparative Examples is chucked 1000 times onto a wafer chuck of a robot hand for wafer transport (stress evaluation), after which measurement is made in a DCO mode with a laser particle counter (SP-3, manufactured by KLA-Tencor Corporation), and a number of LPDs with a size of 35 nm or more is found.

(Description of Evaluation Results)

With reference to FIGS. 4 and 5, in Comparative Examples 1 to 3, the angle α1 is set to be larger than the target value of the angle θ1. Therefore, the ESFQRmax is reduced to 45 nm or less, and it is possible to reduce or inhibit over-polishing. However, the degree of corner burring inhibition is less than 180 µm and it is not possible to reduce or inhibit the corner burrs. Meanwhile, in Exemplary Disclosures 1 to 3, it is possible to accomplish both a reduction in the ESFQRmax to 45 nm or less and a reduction of over-polishing to an acceptable level, regardless of whether the angle α1 is set to be equal to or less than the target value of the angle θ1. Moreover, in Exemplary Disclosure 1, the degree of corner burring inhibition is 180 µm or more and it is possible to reduce or inhibit corner burrs, while in Exemplary Disclosures 2 and 3 the degree of corner burring reduction or inhibition is 200 µm or more and it is possible to further reduce or inhibit corner burrs. In Exemplary Disclosure 4, although the degree of corner burring inhibition is favorable, the angle α1 is configured to be too small, and therefore the ESFQRmax exceeds 45 nm, and it is not possible to reduce or inhibit over-polishing to an acceptable level. It is similarly possible to reduce or inhibit corner burrs for the rear surface, as well.

In addition, with respect to LPDs, in Comparative Examples 1 to 3, the degree of corner burring reduction or inhibition is less than 180 µm, and therefore there are between 2 and 10 LPDs per wafer. This is caused by the occurrence of debris at the time of chucking. In contrast, in Exemplary Disclosure 1, the degree of corner burring inhibition is 180 µm or more, and therefore there is one LPD per wafer, and the occurrence of debris is reduced or inhibited. Also, in Exemplary Disclosures 2 to 4, the degree of corner burring reduction or inhibition is 200 pin or more, and therefore there are between 0.1 and 0.7 LPDs per wafer, and the occurrence of debris is further inhibited.

Figure 6:
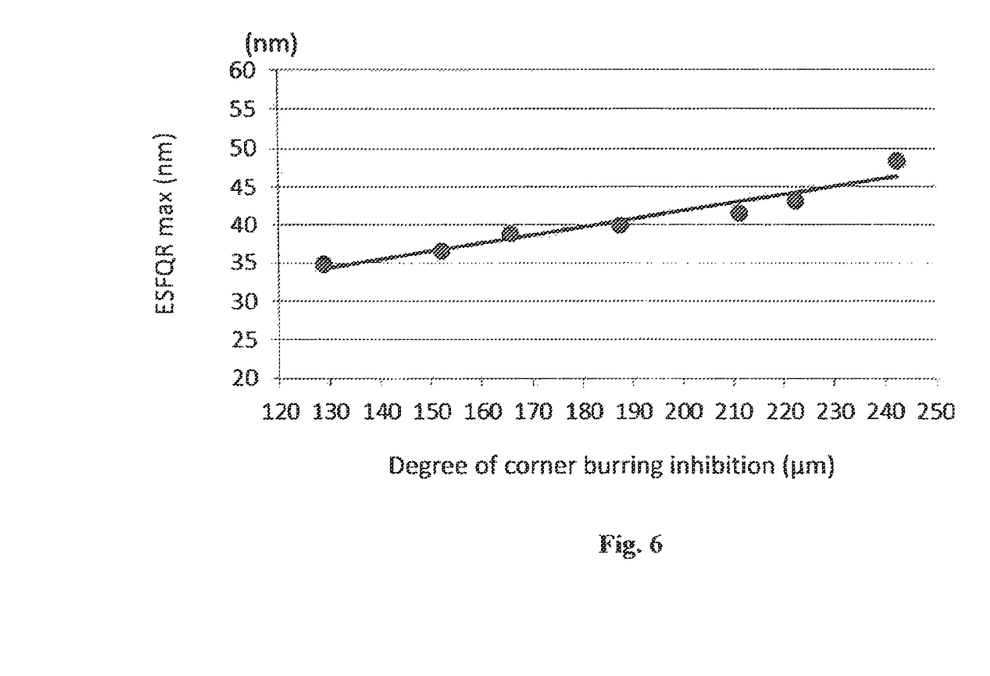
FIG. 6 is a graph illustrating a relationship between the degree of corner burring inhibition and the flatness, according to example features.

FIG. 6 is a graph illustrating a relationship between the degree of corner burring inhibition and the flatness, according to example features. In FIG. 6, the example features having a degree of corner burring inhibition measured in micrometers (µm) that are equal to or less than substantially 230 µm exhibit an advantageous combination of reduction or inhibition of corner burring and flatness. However, as indicated in FIG. 6, if the degree of corner burring inhibition is greater than substantially 230 μm, then the flatness of the wafer becomes greater than substantially 45 nm, and thus becomes undesirable. As a result, a desired range of degree of corner inhibition is between substantially 180 μm and 230 μm, which results in a wafer in which corner burrs at the boundary between the main surface of the wafer and the chamfered surface are reduced or inhibited.

It is noted that the foregoing examples have been provided merely for the purpose of explanation and are in no way to be construed as limiting of the present disclosure. While the present disclosure has been described with reference to exemplary features, it is understood that the words which have been used herein are words of description and illustration, rather than words of limitation. Changes may be made, within the purview of the appended claims, as presently stated and as amended, without departing from the scope and spirit of the present disclosure in its aspects. Although the example features have been described herein with reference to particular structures, materials and features, the example features are not intended to be limited to the particulars disclosed herein; rather, the example features extend to all functionally equivalent structures, methods and uses, such as are within the scope of the appended claims.

The present disclosure is not limited to the above described features, and various variations and modifications may be possible without departing from the scope of the present disclosure.

What is claimed is:

1. A method of polishing a chamfered surface of a wafer, the method comprising:
    beveling the wafer to generate the chamfered surface, the generated chamfered surface being inclined with respect to a main surface of the wafer by an angle θ; and
    polishing the chamfered surface with a polishing pad by inclining a longitudinal surface of the polishing pad by an angle α with respect to the chamfered surface during the polishing;
    wherein:
    the angle α is smaller than the angle θ;
    the wafer includes a front wafer surface and a rear wafer surface;
    the beveling the wafer comprises generating a front chamfered surface and a rear chamfered surface; and
    after the polishing, a degree of corner burring inhibition at least at one of a boundary between the front wafer surface and the front chamfered surface and at a boundary between the rear wafer surface and the rear chamfer surface is 180 μm or more.

2. The method of claim 1, wherein the angle θ is in a range of 22° or more to 26° or less.

3. The method of claim 2, wherein the polishing the chamfered surface comprises inclining the longitudinal surface of the polishing pad by the angle α in a range of 20° or more.

4. The method of claim 1, wherein the polishing the chamfered surface comprises oscillating the polishing pad in the longitudinal direction thereof via a polishing pad mounting jig, the polishing pad being in contact with the wafer at the chamfered surface.

5. The wafer according to claim 1, wherein the degree of corner burring inhibition is equal to 200 μm or more.

6. The wafer according to claim 1, wherein the degree of corner burring inhibition is equal to 230 μm or less.

7. The wafer according to one of claim 1, wherein the polishing the chamfered surface generates a chamfer surface having a flatness of expressed as ESFQRmax equal to or smaller than 45 nm.

8. The method of claim 1, wherein the polishing the chamfered surface comprises:
    attaching the wafer to a stage that is mounted on a wafer surface beveling device;
    positioning the polishing pad, the polishing pad being mounted on a polishing pad mounting jig, so as to be inclined with respect to the main surface of the wafer and in contact with the chamfered surface and with a periphery of the main surface of the wafer; and
    oscillating the polishing pad, while the polishing pad is in contact with the chamfered surface and with the periphery of the main surface of the wafer, in a direction parallel to the longitudinal surface.

9. The method of claim 8, wherein during the polishing of the chamfered surface, the polishing pad mounting jig rotates along a circumference of the wafer.

10. The method of claim 8, wherein during the polishing of the chamfered surface, the wafer rotates around a central axis thereof.

11. The method of claim 8, wherein a diameter of the stage at a surface thereof that is in contact with the wafer is greater than the diameter at an opposite surface thereto.

12. The method of claim 11, wherein an angle of inclination of a side surface of the stage between the surface thereof that is in contact with the wafer and the opposite surface thereto is equal to or smaller than 20°.

13. The method of claim 1, wherein the beveling the wafer to generate the chamfered surface comprises beveling the wafer to generate a chamfer having a width between 200 μm and 450 μm.

14. The method of claim 1, wherein the beveling the wafer to generate the chamfered surface comprises beveling the wafer to generate a chamfer having a thickness between 80 μm and 240 μm.

15. The method of claim 1, wherein the beveling the wafer to generate the chamfered surface comprises beveling the wafer to generate a chamfer portion having a curvature radius between 200 μm and 250 μm.

16. The method of claim 1, wherein the beveling the wafer generates the chamfered surface having a length of an end surface in a thickness direction of the wafer between 300 μm and 600 μm.

17. A wafer, comprising:
    a front main wafer surface and a rear main wafer surface; and
    a front chamfered surface and a rear chamfered surface, the front chamfered surface being inclined with respect to the front main surface by an angle θ1, and the rear chamfered surface being inclined with respect to the rear main surface by an angle θ2;
    wherein a degree of corner burring inhibition at least at one of a boundary between the front main wafer surface and the front chamfered surface and a boundary between the rear main wafer surface and the rear chamfer surface is 180 μm or more.

18. The wafer of claim 17, wherein at least one of the front chamfered surface and the rear chamfered surface has a width between 200 μm and 450 μm.

19. The wafer of claim 17, wherein a thickness of at least one of the front chamfered surface and the rear chamfered surface is between 80 μm and 240 μm.

20. The wafer of claim 17, wherein at least one of a portion of the front chamfered surface and a portion of the rear chamfered surface has a curvature radius between 200 μm and 250 μm.

21. The wafer of claim 17, wherein a length of an end surface of the wafer in a thickness direction thereof between the front chamfered surface and the rear chamfered surface is between 300 μm and 600 μm.

22. The wafer of claim 17, wherein at least one of the angles θ1 and θ2 is in a range of 22° or more to 26° or less.

23. A method of polishing a chamfered surface of a wafer, the method comprising:
  beveling the wafer to generate the chamfered surface, the generated chamfered surface being inclined with respect to a main surface of the wafer by an angle θ; and
  polishing the chamfered surface with a polishing pad by inclining a longitudinal surface of the polishing pad by an angle α with respect to the chamfered surface during the polishing;
  wherein:
  the angle α is smaller than the angle θ; and
  the polishing the chamfered surface generates a chamfer surface having a flatness of expressed as ESFQRmax equal to or smaller than 45 nm.

\* \* \* \* \*